United States Patent
Paul et al.

(10) Patent No.: US 9,023,705 B1
(45) Date of Patent: May 5, 2015

(54) METHODS OF FORMING STRESSED MULTILAYER FINFET DEVICES WITH ALTERNATIVE CHANNEL MATERIALS

(71) Applicant: GLOBALFOUNDRIES Inc., Grand Cayman (KY)

(72) Inventors: Abhijeet Paul, Albany, NY (US); Ajey Poovannummoottil Jacob, Albany, NY (US); Min-hwa Chi, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/069,868

(22) Filed: Nov. 1, 2013

(51) Int. Cl.
| | |
|---|---|
| *H01L 21/84* | (2006.01) |
| *H01L 29/66* | (2006.01) |
| *H01L 21/02* | (2006.01) |
| *H01L 29/78* | (2006.01) |
| *H01L 29/10* | (2006.01) |
| *H01L 21/8232* | (2006.01) |
| *H01L 29/423* | (2006.01) |
| *H01L 27/088* | (2006.01) |
| *H01L 27/105* | (2006.01) |
| *H01L 29/08* | (2006.01) |

(52) U.S. Cl.
CPC .... *H01L 29/66795* (2013.01); *H01L 21/02587* (2013.01); *H01L 29/7848* (2013.01); *H01L 29/785* (2013.01); *H01L 29/1054* (2013.01); *H01L 21/8232* (2013.01); *H01L 29/1079* (2013.01); *H01L 27/105* (2013.01); *H01L 21/845* (2013.01); *H01L 29/0847* (2013.01); *H01L 29/42392* (2013.01); *H01L 27/0886* (2013.01)

(58) Field of Classification Search
CPC .......................... H01L 21/8232; H01L 21/107
See application file for complete search history.

(56) References Cited

U.S. PATENT DOCUMENTS

2011/0095372 A1* 4/2011 Yuan et al. .................... 257/368

* cited by examiner

*Primary Examiner* — Cheung Lee
(74) *Attorney, Agent, or Firm* — Amerson Law Firm, PLLC

(57) ABSTRACT

Disclosed are methods and devices that involve formation of alternating layers of different semiconductor materials in the channel region of FinFET devices. The methods involve forming such alternating layers of different semiconductor materials in a cavity formed above the substrate fin and thereafter forming a gate structure around the fin using gate first or gate last techniques.

10 Claims, 16 Drawing Sheets

METHODS OF FORMING STRESSED MULTILAYER FINFET DEVICES WITH ALTERNATIVE CHANNEL MATERIALS

BACKGROUND OF THE INVENTION

1. Field of the Invention

Generally, the present disclosure relates to the manufacture of semiconductor devices, and, more specifically, to various methods of forming stressed multilayer FinFET devices with alternative channel materials.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

As device dimensions decrease and customers demand higher performance devices, device designers are under constant pressure to increase the operating speed and electrical performance of transistors and integrated circuit products that employ such transistors. Given that the gate length (the distance between the source and drain regions) on modern transistor devices may be approximately 20-50 nm, and that further scaling is anticipated in the future, device designers have employed a variety of techniques in an effort to improve device performance, e.g., the use of high-k dielectrics, the use of metal gate electrode structures, the incorporation of work function metals in the gate electrode structure, etc. Another technique to improve device performance involves the use of channel stress engineering techniques on transistors (to create a tensile stress in the channel region for NFET transistors and to create a compressive stress in the channel region for PFET transistors). With respect to planar FET devices, stress engineering techniques typically involve the formation of specifically made silicon nitride layers that are selectively formed above the appropriate transistors, i.e., a layer of silicon nitride that is intended to impart a tensile stress in the channel region of a NFET transistor would only be formed above the NFET transistors. Such selective formation may be accomplished by masking the PFET transistors and then blanket depositing the layer of silicon nitride, or by initially blanket depositing the layer of silicon nitride across the entire substrate and then performing an etching process to selectively remove the silicon nitride from above the PFET transistors. Conversely, for PFET transistors, a layer of silicon nitride that is intended to impart a compressive stress in the channel region of a PFET transistor is formed above the PFET transistors. By forming such stressed layers on the source/drain regions of the devices, the desired stress is induced in the channel region of the planar devices. The techniques employed in forming such nitride layers with the desired tensile or compressive stress are well known to those skilled in the art. However, when it comes to FinFET devices, the formation of such stressed nitride layers on the source/drain regions is not as effective at inducing the desired stress characteristics in the channel region of the FinFET device. This is believed to be due to the remoteness of the source/drain regions and the structural differences between planar and FinFET devices. Device designers are also under constant pressure to reduce production costs relative to previous device generations. Thus, device designers spend a great amount of time and effort to maximize device performance while seeking ways to reduce manufacturing costs and improve manufacturing reliability. As it relates to 3D devices, device designers have spent many years and employed a variety of techniques in an effort to improve the performance capability and reliability of such devices. Device designers are currently investigating using alternative semiconductor materials, such as so-called III-V materials, to manufacture FinFET devices, which are intended to enhance the performance capabilities of such devices, e.g., to enable low-voltage operation. However, the integration of such alternative materials on silicon substrates (the dominant substrates used in the industry) is a non-trivial matter due to, among other issues, the large difference in lattice constants between such materials and silicon.

The present disclosure is directed to methods of forming stressed multilayer FinFET devices with alternative channel materials that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to methods of forming stressed multilayer FinFET devices with alternative channel materials. One illustrative method disclosed herein involves performing at least one first etching process to define a plurality of spaced-apart trenches in a substrate so as to define a substrate fin that is comprised of a first semiconductor material, performing at least one process operation to form a substrate fin cavity above the substrate fin, wherein the substrate fin cavity is defined by an exposed upper surface of the substrate fin and a layer of insulating material positioned in the trenches, and forming a first layer of a second semiconductor material on the exposed upper surface of the substrate fin and within the substrate fin cavity, wherein the second semiconductor material is a different semiconductor material than the first semiconductor material. In this embodiment, the method further comprises forming a first layer of the first semiconductor material on the first layer of the second semiconductor material and within the substrate fin cavity, performing at least one second etching process on the layer of insulating material such that an upper surface of the layer of insulating material after the at least one second etching process is performed is below the upper surface of the substrate fin so as to thereby expose a fin for the FinFET device that is comprised of at least the first layer of the second semiconductor material and the first layer of the first semiconductor material, and forming a gate structure around at least the first layer of the second semiconductor material and the first layer of the first semiconductor material.

Another illustrative method disclosed herein involves performing at least one first etching process to define a plurality of spaced-apart trenches in a substrate so as to define a substrate fin that is comprised of a first semiconductor material and a first layer of a second semiconductor material positioned on the substrate fin, wherein the second semiconductor material is a different semiconductor material than the first semiconductor material, performing at least one process operation to form a cavity above the layer of the second semiconductor material and above the substrate fin, wherein the cavity is defined by an exposed upper surface of the first layer of the second semiconductor material and a layer of insulating material positioned in the trenches, and performing at least a second etching process on the exposed surface of the first layer of the second semiconductor material to reduce its thickness and thereby define a reduced thickness first layer of the second semiconductor material and define a fin cavity that is defined by an upper surface of the reduced thickness first layer of the second semiconductor material and the layer of insulating material positioned in the trenches. In this embodiment, the method further involves forming a first layer of the first semiconductor material on the reduced thickness first layer of the second semiconductor material and within the fin cavity, performing at least one third etching process on the layer of insulating material such that an upper surface of the layer of insulating material after the at least one third etching process is performed is below an upper surface of the substrate fin so as to thereby expose a fin for the FinFET device that is comprised of at least the reduced thickness first layer of the second semiconductor material and the first layer of the first semiconductor material, and forming a gate structure around at least the reduced thickness first layer of the second semiconductor material and the first layer of the first semiconductor material.

One illustrative device disclosed herein includes a substrate fin comprised of a first semiconductor material, a first layer of a second semiconductor material positioned on an upper surface of the substrate fin, wherein the second semiconductor material is a different semiconductor material than the first semiconductor material, a first layer of the first semiconductor material positioned on and above the first layer of the second semiconductor material and a gate structure positioned around at least the first layer of the second semiconductor material, the first layer of the first semiconductor material and at least a portion of the substrate fin.

BRIEF DESCRIPTION OF THE DRAWINGS

The disclosure may be understood by reference to the following description taken in conjunction with the accompanying drawings, in which like reference numerals identify like elements, and in which.

Figure 1A:
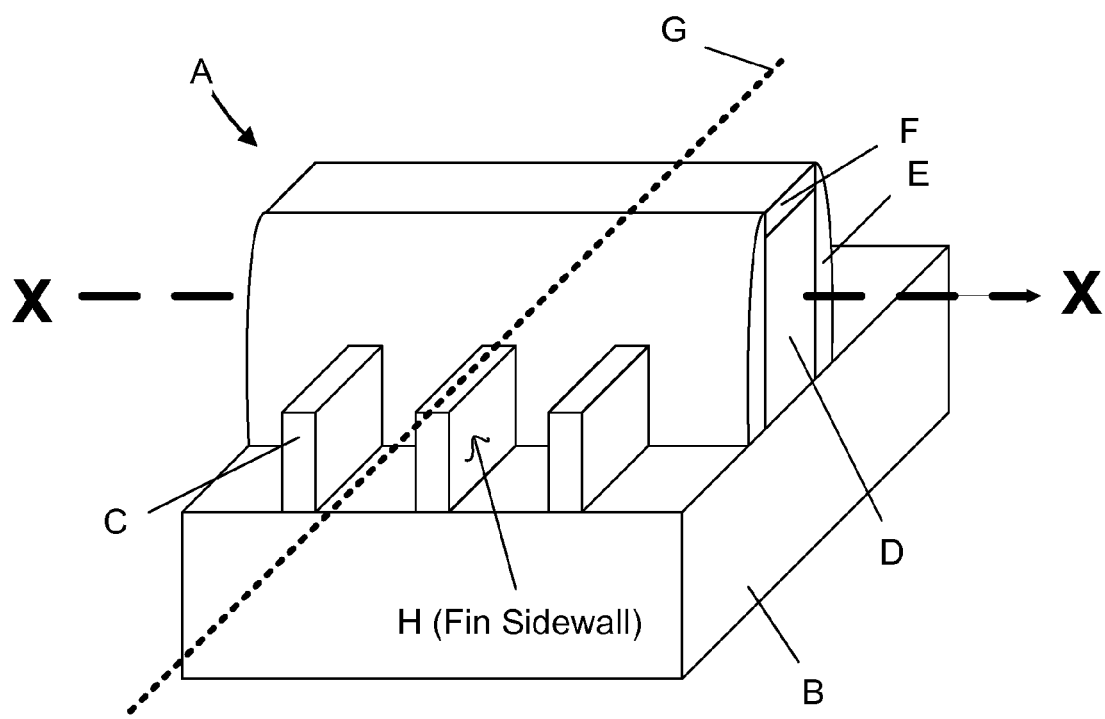
FIGS. 1A-1L depict one illustrative method disclosed herein for forming stressed multilayer FinFET devices with alternative channel materials.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming stressed multilayer FinFET devices with alternative channel materials and the resulting device structures. The method disclosed herein may be employed in manufacturing either an N-type device or a P-type device, and the gate structure of such devices may be formed using either so-called "gate-first" or "replacement gate" ("gate-last") techniques. As will be readily apparent to those skilled in the art upon a complete reading of the present application, the inventions disclosed herein are applicable to a variety of devices, including, but not limited to, logic devices, memory devices, etc., and the methods disclosed herein may be employed to form N-type or P-type semiconductor devices. With reference to the attached figures, various illustrative embodiments of the methods and devices disclosed herein will now be described in more detail.

FIG. 1A is a perspective view of a reference FinFET semiconductor device that is provided for reference purposes as it relates to several basic features of the FinFET device A. The FinFET device A is formed above a semiconductor substrate B. The FinFET device A typically includes a plurality of fins C, a gate electrode D, sidewall spacers E and a gate cap layer F. The sidewalls of the fins C is denoted by the letter H. The dashed line G depicts the long-axis or centerline of the fins C and the direction of current transport in the device A. View "X-X" in FIG. 1A depicts the locations where various cross-sectional views of the devices disclosed herein may be taken in the drawings discussed below, i.e., in a direction that is parallel to the long-axis of the gate electrode D (the gate width direction). The portions of the fins C covered by the gate electrode D are the channel regions of the FinFET device A. In a conventional process flow, the portions of the fins C that are positioned in the source/drain regions may be increased in size or even merged together (not shown in FIG. 1A) by performing one or more epitaxial growth processes. The process of increasing the size of or merging the fins C in the source/drain regions of the device is performed to, among other things, reduce the resistance of source/drain regions and/or to induce tensile or compressive stress in the channel area of the device A.

The devices disclosed herein may be formed using a variety of techniques. FIGS. 1B-1L depict one illustrative method disclosed herein for forming stressed multilayer FinFET devices with alternative channel materials. In the attached drawings, the devices are depicted as being formed above a semiconductor substrate 10 comprised of a first semiconductor material, such as, for example, silicon, etc. The illustrative substrate 10 may be a bulk semiconductor substrate, or it may be the active layer of a so-called SOI (silicon-on-insulator) substrate or a so-called SGOI (silicon-germanium-on-insulator) substrate. Thus, the terms "substrate," "semiconductor substrate" or "semiconducting substrate" should be understood to cover all semiconductor materials and all forms of such semiconductor materials.

Figure 1B:
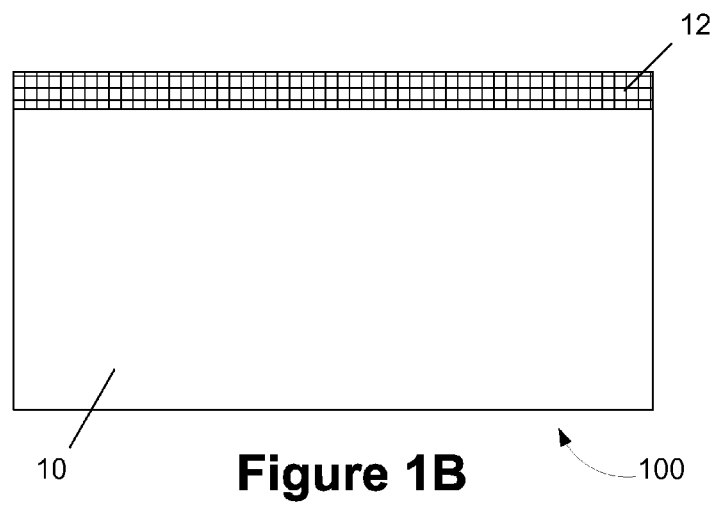

At the point of fabrication depicted in FIG. 1B, a hard mask layer 12 has been formed above the substrate 10. The hard mask layer 12 may be comprised of a variety of different materials and take a variety of different forms. The hard mask layer 12 is intended to be representative in nature as it could be comprised of a variety of materials, such as, for example, silicon nitride, silicon oxynitride, hafnium oxide, etc. Moreover, the hard mask layer 12 could be comprised of multiple layers of material. For example, the hard mask layer 12 may be comprised of a layer of silicon dioxide, e.g., a pad oxide layer, and a layer of silicon nitride, e.g., a pad nitride layer, that were formed above the substrate 10 by performing known deposition techniques, e.g., chemical vapor deposition (CVD) processes, atomic layer deposition (ALD) processes, etc. In one illustrative embodiment, the hard mask layer 12 may be a layer of silicon nitride having a thickness of about 40 nm.

Figure 1C:
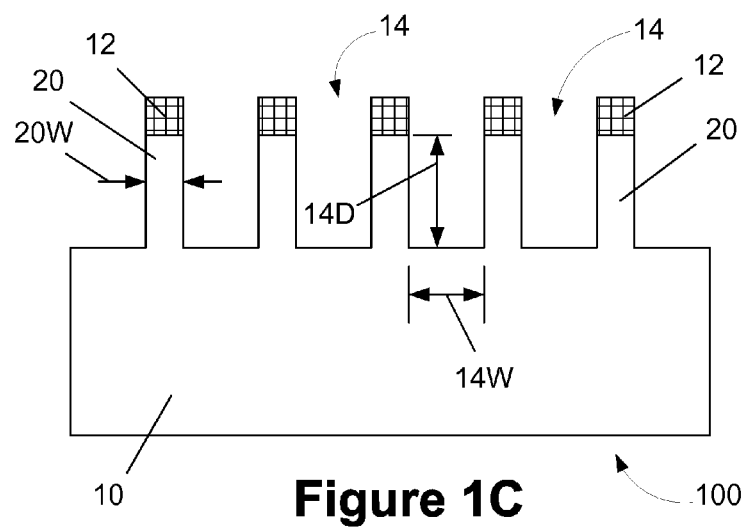

FIG. 1C depicts the device 100 after several process operations were performed. First, the hard mask layer 12 was patterned using known sidewall image transfer techniques and/or photolithographic techniques combined with performing known etching techniques. Next, an etching process, such as a dry or wet etching process, was performed on the substrate 10 through the patterned hard mask layer 12 to form a plurality of trenches 14. This etching process results in the definition of a plurality of substrate fins 20. In some applications, a further etching process may be performed to reduce the width or to "thin" the substrate fins 20, although such a thinning process is not depicted in the attached drawings. For purposes of this disclosure and the claims, the use of the terms "fin" or "fins" should be understood to refer to fins that have not been thinned as well as fins that have been subjected to such a thinning etch process.

With continuing reference to FIG. 1C, the overall size, shape and configuration of the trenches 14 and substrate fins 20 may vary depending on the particular application. The depth 14D and width 14W of the trenches 14 may vary depending upon the particular application. In one illustrative embodiment, based on current-day technology, the depth 14D of the trenches 14 may range from approximately 40-100 nm and the width 14W of the trenches 14 may be about 20-40 nm. In some embodiments, the substrate fins 20 may have a final width 20W (at or near the bottom of the fin) within the range of about 15-20 nm. In the illustrative examples depicted in the attached figures, the trenches 14 and substrate fins 20 are all of a uniform size and shape. However, such uniformity in the size and shape of the trenches 14 and the substrate fins 20 is not required to practice at least some aspects of the inventions disclosed herein. In the example depicted herein, the trenches 14 are formed by performing an anisotropic etching process that results in the trenches 14 having a schematically depicted, generally rectangular configuration. In an actual real-world device, the sidewalls of the trenches 14 may be somewhat inwardly tapered, although that configuration is not depicted in the drawings. In some cases, the trenches 14 may have a reentrant profile near the bottom of the trenches 14. To the extent the trenches 14 are formed by performing a wet etching process, the trenches 14 may tend to have a more rounded configuration or non-linear configuration as compared to the generally rectangular configuration of the trenches 14 that are formed by performing an anisotropic etching process. Thus, the size and configuration of the trenches 14 and the substrate fins 20, and the manner in which they are made, should not be considered a limitation of the present invention. For ease of disclosure, only the substantially rectangular trenches 14 and substrate fins 20 will be depicted in subsequent drawings.

Figure 1D:
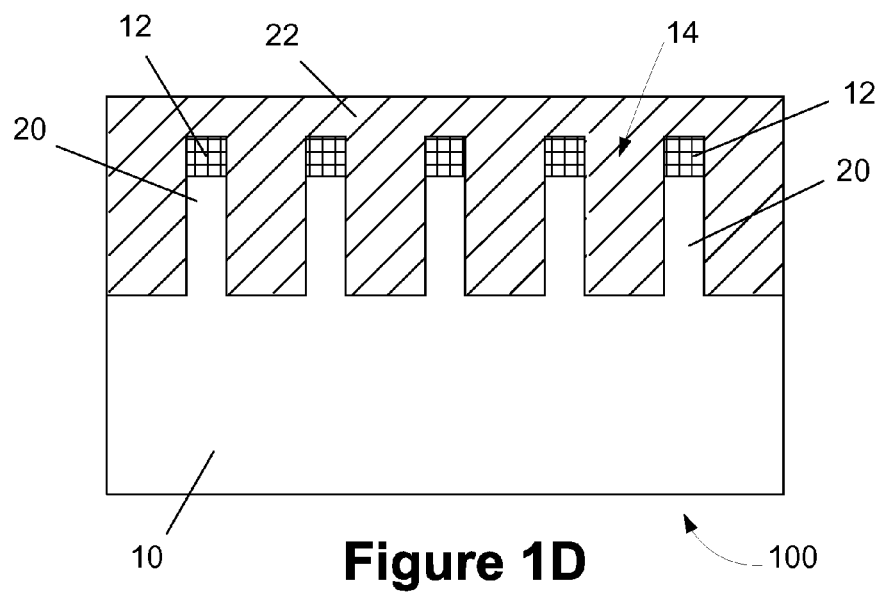

Then, as shown in FIG. 1D, a layer of insulating material 22 is formed in the trenches 14 of the device such that it overfills the trenches 14. The layer of insulating material 22 may be comprised of a variety of different materials, such as silicon dioxide, etc., and it may be formed by performing a variety of techniques, e.g., CVD, spin-coating, etc. In one illustrative embodiment, the layer of insulating material 22 may be a layer of silicon dioxide or a flowable oxide material that is formed by performing a CVD process. In the example depicted in FIG. 1D, the surface of the layer of insulating material 22 may be positioned slightly above the upper surface of the patterned hard mask layer 12.

Figure 1E:
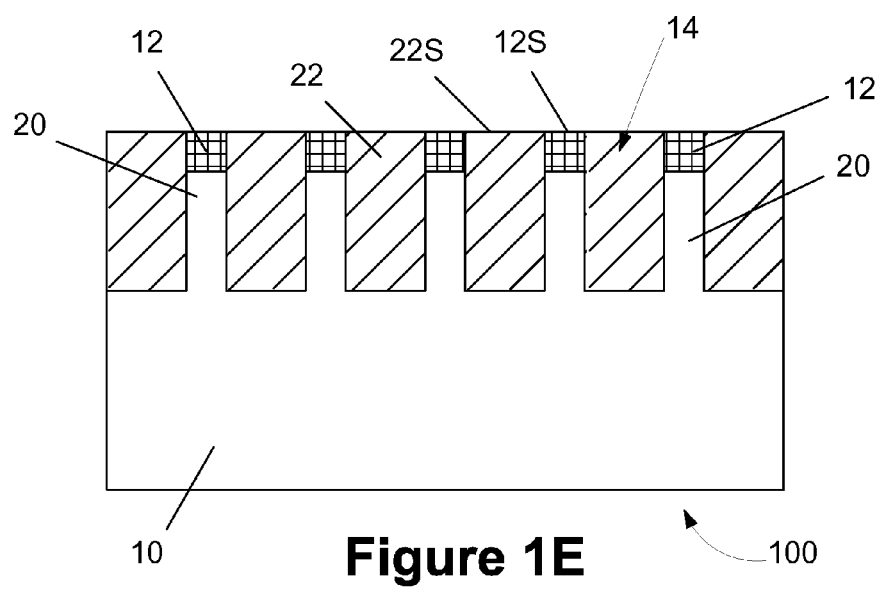

Next, as shown in FIG. 1E, one or more chemical mechanical polishing (CMP) processes may be performed to planarize the surface of the layer of insulating material 22 using the patterned hard mask layer 12 to stop the CMP process. After such a CMP process, the surface 22S of the layer of insulating material 22 is substantially level with the surface 12S of the patterned hard mask layer 12.

Figure 1F:
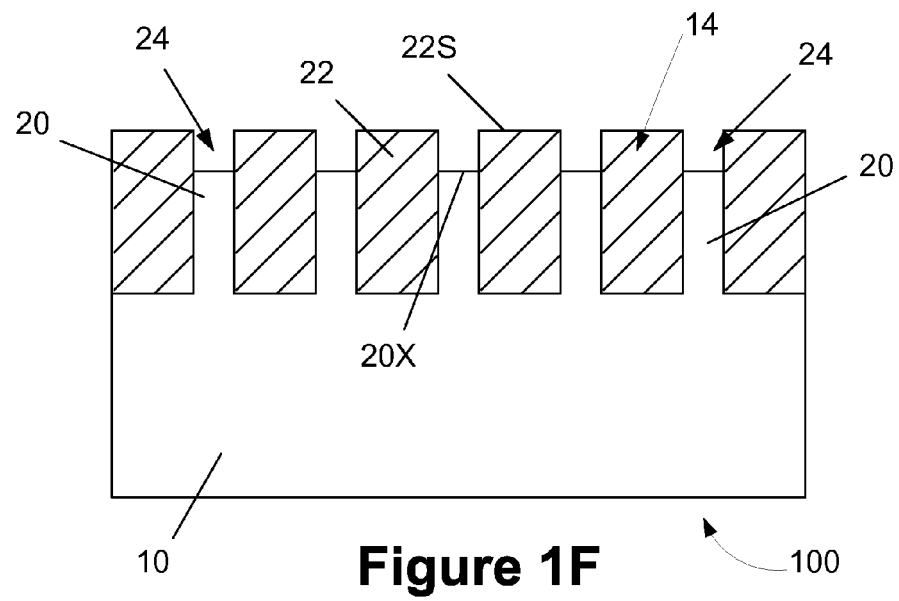

Next, as shown in FIG. 1F, one or more etching processes, wet or dry, are performed to remove the patterned hard mask layer 12 from above the substrate fins 20 and thereby define a plurality of substrate fin cavities 24 that expose the upper surface 20X of the substrate fins 20 for further processing. In this illustrative embodiment, the substrate fin cavities 24 have a depth that corresponds to the thickness of the patterned hard mask layer 12. In general, the substrate fin cavities 24 may have an aspect ratio of about 5 or less.

Figure 1G:
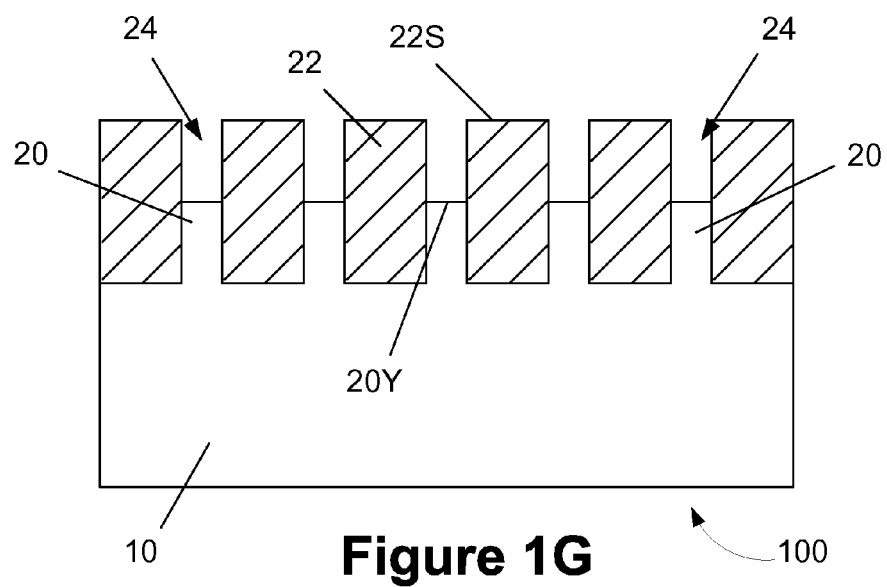

FIG. 1G depicts the device 100 after another etching process, such as a dry, wet or vapor phase etching process, may be performed to reduce the height of the substrate fins 20, i.e., increase the depth of the substrate fin cavities 24. This etching process results in the substrate fins 20 having a recessed surface 20Y. In some applications, this etching process may be a reactive ion etching (RIE) process. In other applications, the etching process may be an isotropic etching process that uses HCl vapor to selectively remove the silicon substrate relative to the surrounding oxide materials.

Figure 1H:
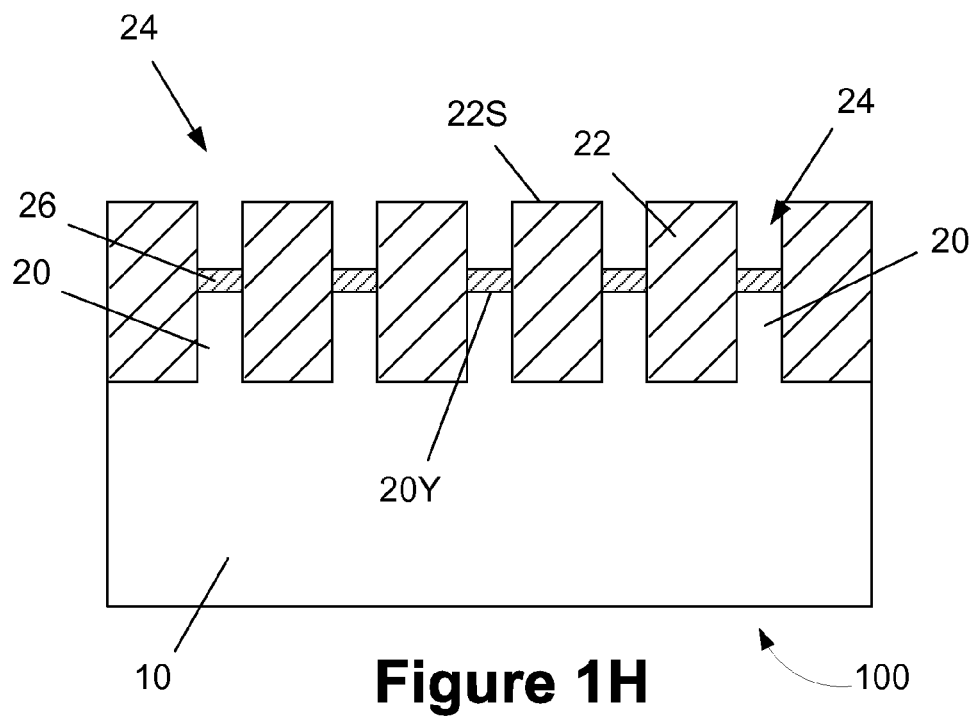

FIG. 1H depicts the device 100 after a first layer 26 of alternative semiconductor material that is different than the semiconductor material of the substrate fins 20 is formed on the surface 20Y of the substrate fins 20 within the substrate fin cavities 24 by performing an epitaxial growth process. The first layer 26 of alternative semiconductor material may be comprised of a variety of different semiconductor materials, e.g., silicon/germanium ($Si_xGe_{1-x}$), silicon/carbon, one or more III-V materials, one or more II-VI materials, InP, InAs, GaAs, InGaAs, InSb, InGaSb, etc., or combinations thereof, and it may be either doped (in situ) or undoped. In one illustrative embodiment, the first layer 26 of alternative semiconductor material may be a fully-strained layer of silicon/germanium ($SiGe_{0.5}$) having a thickness of about 3-6 nm. Since silicon/germanium has a larger lattice structure than that of the underlying silicon substrate fins 20, the first layer 26 of alternative semiconductor material will tend to "shrink" to match the lattice structure of the silicon substrate fins 20. This will result in the first layer 26 of alternative semiconductor material having a compressive stress, the magnitude of which may range from about −500 to −2000 MPa.

Figure 1I:
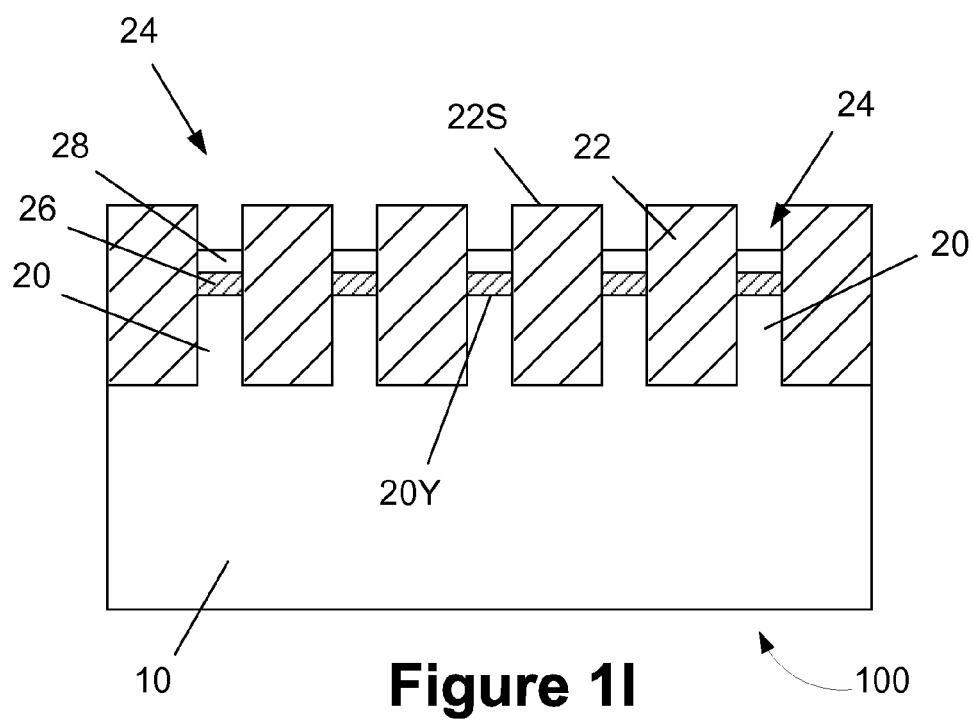

FIG. 1I depicts the device 100 after a first layer 28 of substrate semiconductor material, e.g., silicon, is formed above the first layer 26 of alternative semiconductor material within the substrate fin cavities 24 by performing an epitaxial growth process. In one illustrative embodiment, the first layer 28 of substrate semiconductor material may be a substantially unstrained layer of silicon having a thickness of about 3-6 nm. The first layer 28 of substrate semiconductor material will be substantially unstrained since its lattice structure is substantially the same as that of the underlying substrate 10.

Figure 1J:
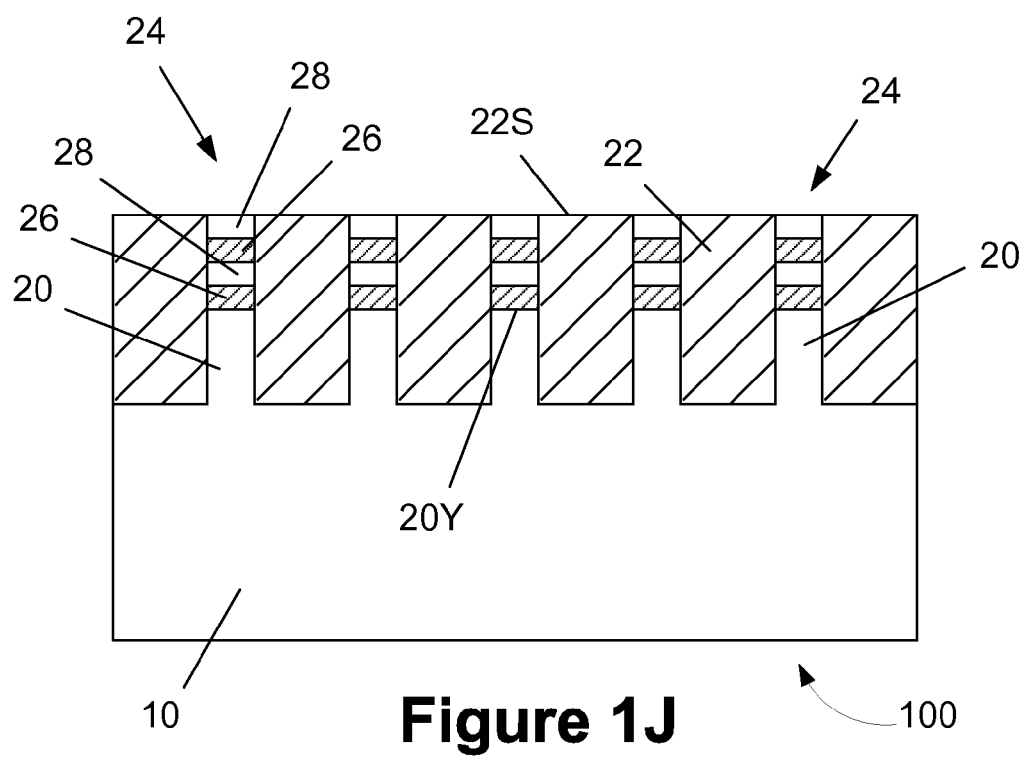

FIG. 1J depicts the device 100 after additional layers 26, 28 are alternatively formed in the substrate fin cavities 24. In the depicted example, two layers 26 and two layers 28 have been formed so as to substantially fill the substrate fin cavities 24. However, the number and thickness of the layers 26, 28 that are formed may vary depending upon the particular application. Moreover, all of the layers 26 need not be all formed to the same thickness nor is it required that they be made of the same alternative semiconductor material. Similarly, the layers 28 of substrate semiconductor material need not all have the same thickness. FIG. 1J depicts the device 100 after a very light or "touch-up" CMP process was performed to planarize the upper surface of the device 100.

Figure 1K:
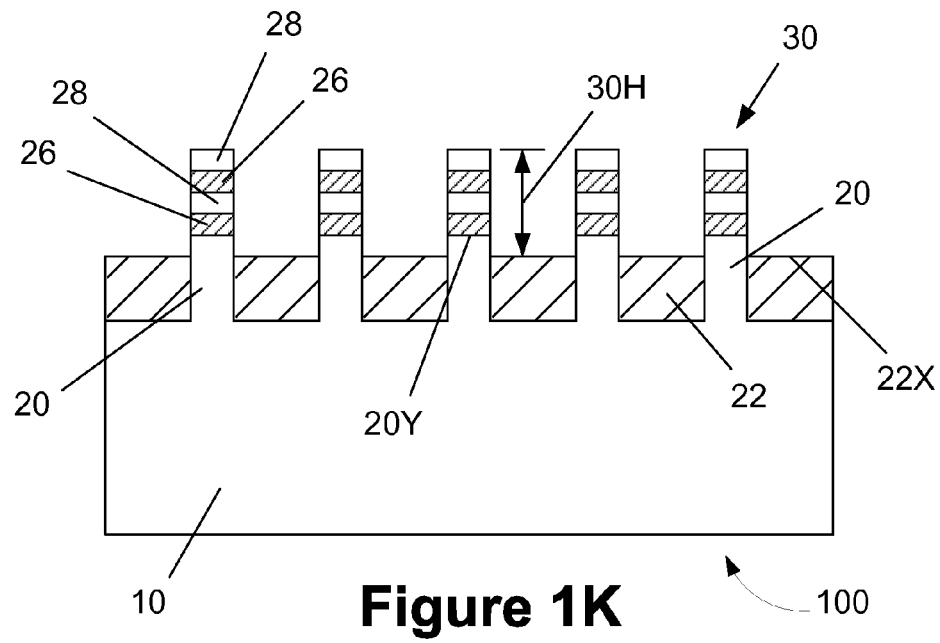

FIG. 1K depicts the device 100 after an etching process has been performed on the layer of insulating material 22 to reduce its thickness and thereby result in the layer of insulating material having a recessed surface 22X. The recessed surface 22X of the layer of insulating material 22 essentially defines the final active fin height 30H of the fins 30 disclosed herein. The final active fin height 30H may vary depending upon the particular application and, in one illustrative embodiment, may range from about 30-60 nm.

Figure 1L:
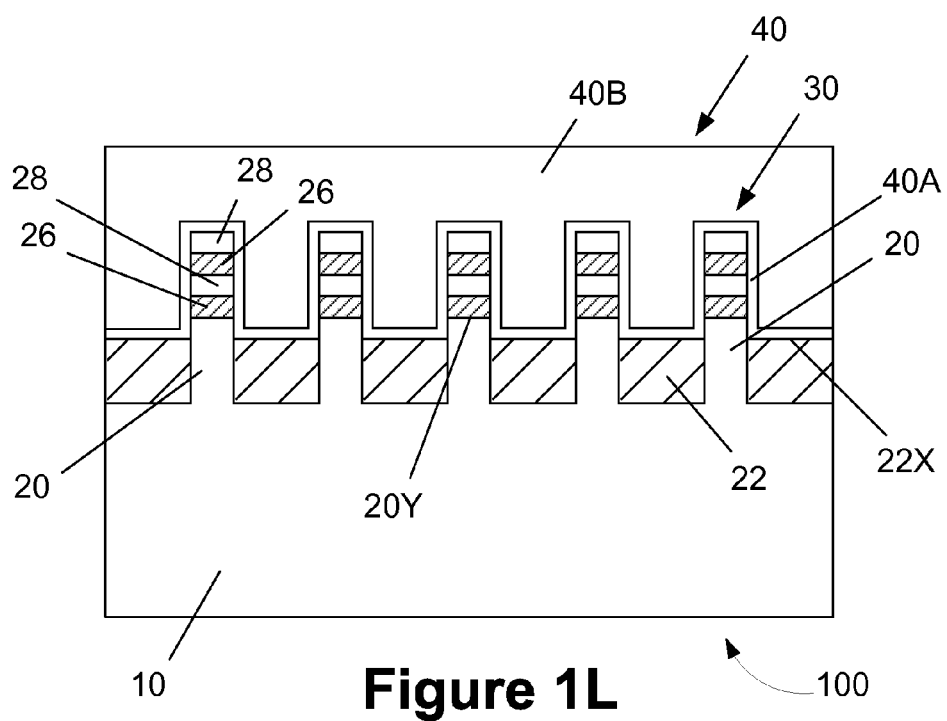

At the point of processing depicted in FIG. 1K, the illustrative FinFET device 100 may be completed using traditional fabrication techniques. For example, FIG. 1L depicts the device 100 after an illustrative gate structure 40 has been formed for the device 100. In one illustrative embodiment, the schematically depicted gate structure 40 includes an illustrative gate insulation layer 40A and an illustrative gate electrode 40B. The gate insulation layer 40A may be comprised of a variety of different materials, such as, for example, silicon dioxide, a so-called high-k (k greater than 10) insulation material (where k is the relative dielectric constant), etc. Similarly, the gate electrode 40B may also be of a material such as polysilicon or amorphous silicon, or it may be comprised of one or more metal layers that act as the gate electrode 40B. As will be recognized by those skilled in the art after a complete reading of the present application, the gate structure 40 of the device 100 depicted in the drawings, i.e., the gate insulation layer 40A and the gate electrode 40B, is intended to be representative in nature. That is, the gate structure 40 may be comprised of a variety of different materials and it may have a variety of configurations, and the gate structure 40 may be made using either the so-called "gate-first" or "replacement gate" techniques. In one illustrative embodiment, an oxidation process or a conformal deposition process may be performed to form a gate insulation layer 40A comprised of a material such as, for example, silicon dioxide, silicon nitride, hafnium oxide, a high-k (k value greater than 10) insulating material, etc., on the fins 30. Thereafter, the gate electrode material 40B and a gate capping layer of material (not shown) may be deposited above the device 100 and the layers may be patterned using known photolithographic and etching techniques and planarized by known CMP techniques. Thereafter, using traditional techniques, sidewall spacers (not shown) may be formed proximate the gate structure 40 by blanket-depositing a layer of spacer material and thereafter performing an anisotropic etching process to define the spacers. It should be noted that, in an alternative process flow, the thickness of the hard mask layer 12 may be increased such that, when it is removed, the substrate gate cavities 24 are formed to a sufficient depth such that the recessing of the substrate fins 20, as depicted in FIG. 1F above, need not be performed.

As will be recognized by those skilled in the art after a complete reading of the present application, the novel device 100 depicted herein is a unique structure that may provide significant benefits and improvements as it relates to the manufacturing of integrated circuit products. First, using the methods disclosed herein, the fins 30 are comprised of one or more of the compressively stressed layers 26 of alternative semiconductor material. Such compressively stressed layers of material should readily enhance the performance of PMOS FinFET devices. Moreover, due to the presence of one or more of the substantially unstrained layers 28 of substrate semiconductor material in the fins 30, the device 100 should be acceptable for forming NMOS FinFET devices as well. Thus, the basic structure of the fins 30 depicted in FIG. 1L may be readily employed in CMOS applications. Second, the stress-inducing materials are formed directly in the channel region of the device 100, as opposed to forming stress-inducing materials in the source/drain regions of the device 100 as was common in the prior art. Of course, if desired, such prior art stress-inducing techniques may be employed in addition to the novel methods disclosed herein. Other advantages will be recognized and appreciated by those skilled in the art after a complete reading of the present application.

Figure 2A:
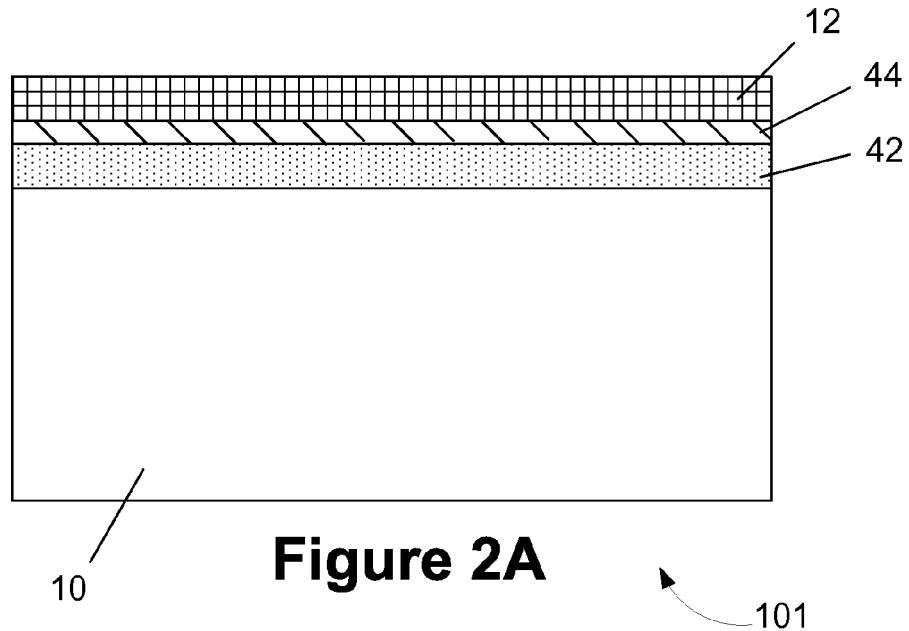
FIGS. 2A-2I depict another illustrative method disclosed herein for forming stressed multilayer FinFET devices with alternative channel materials.

FIGS. 2A-2I depict another illustrative method disclosed herein for forming a stressed multilayer FinFET device 101 with alternative channel materials. With reference to FIG. 2A, in this embodiment, a sacrificial layer of alternative semiconductor material 42 (that is different than the semiconductor material of the substrate 10) is formed on the substrate 10 by performing an epitaxial growth process. The sacrificial layer of alternative semiconductor material 42 may be comprised of a variety of different semiconductor materials, e.g., silicon/germanium, silicon/carbon, one or more III-V materials, one or more II-VI materials, InP, InAs, GaAs, InGaAs, InSb, InGaSb, etc., or combinations thereof, and it may be either doped (in situ) or undoped. In one illustrative embodiment, the sacrificial layer of alternative semiconductor material 42 may be a fully-strained layer of silicon/germanium ($SiGe_{0.5}$) having a thickness of about 30 nm. Since silicon/germanium has a larger lattice structure than that of the underlying substrate 10, the sacrificial layer of alternative semiconductor material 42 will tend to "shrink" to match the lattice structure of the silicon substrate 10. This will result in the sacrificial layer of alternative semiconductor material 42 having a compressive stress, the magnitude of which may range from about −500 to −2000 MPa. With continuing reference to FIG. 2A, a pad oxide layer 44 and the above-described hard mask layer 12 are formed above the sacrificial layer of alternative semiconductor material 42.

Figure 2B:
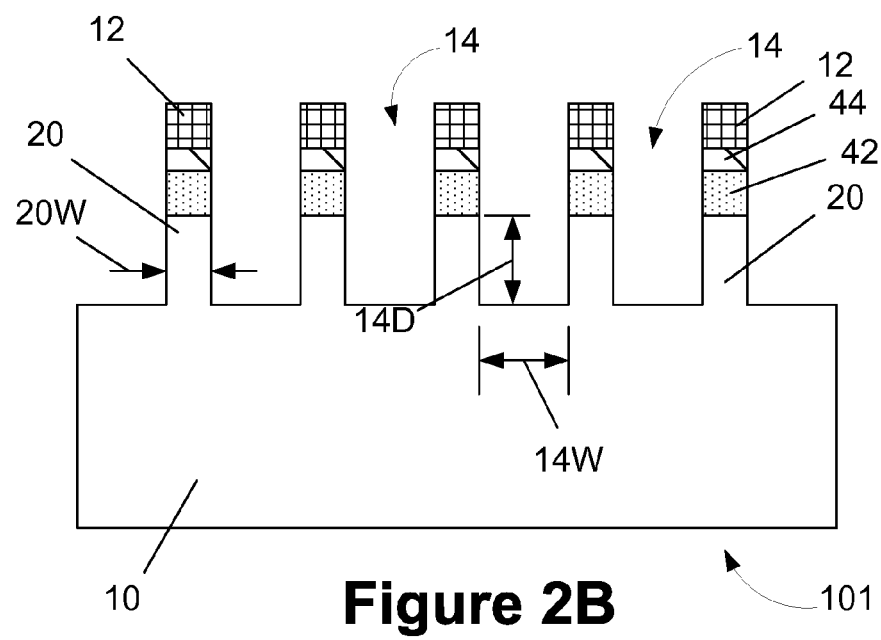

FIG. 2B depicts the device 101 after several process operations were performed. First, the above-described hard mask layer 12 and the pad oxide layer 44 were patterned using known sidewall image transfer techniques and/or photolithographic techniques combined with performing known etching techniques. Next, an etching process, such as a dry or wet etching process, was performed on the substrate 10 through the patterned hard mask layer 12 and pad oxide layer 44 to form the above-described trenches 14. As before, this etching process results in the definition of a plurality of substrate fins 20.

Figure 2C:
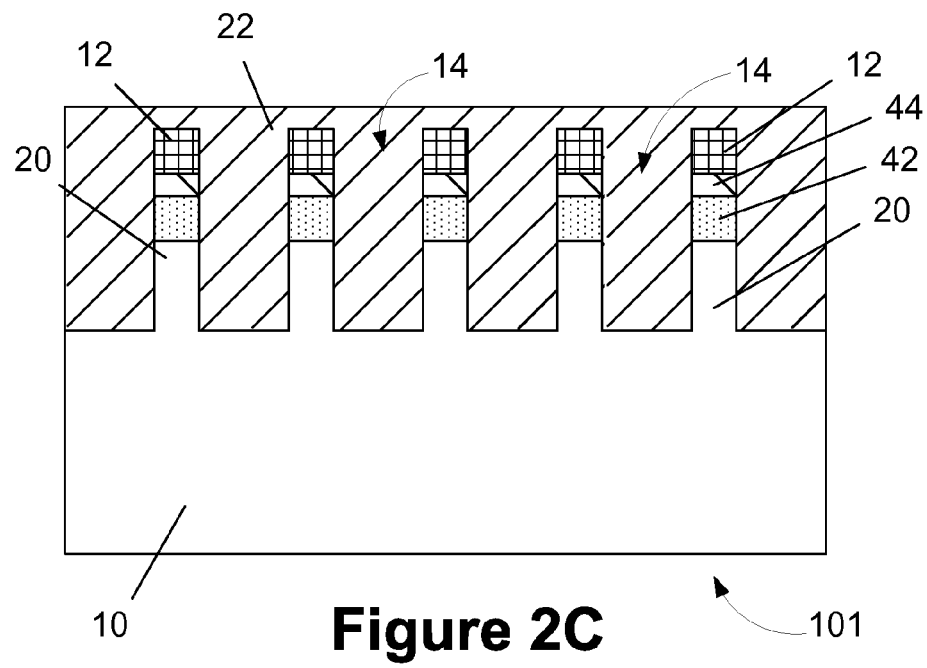
Figure 2D:
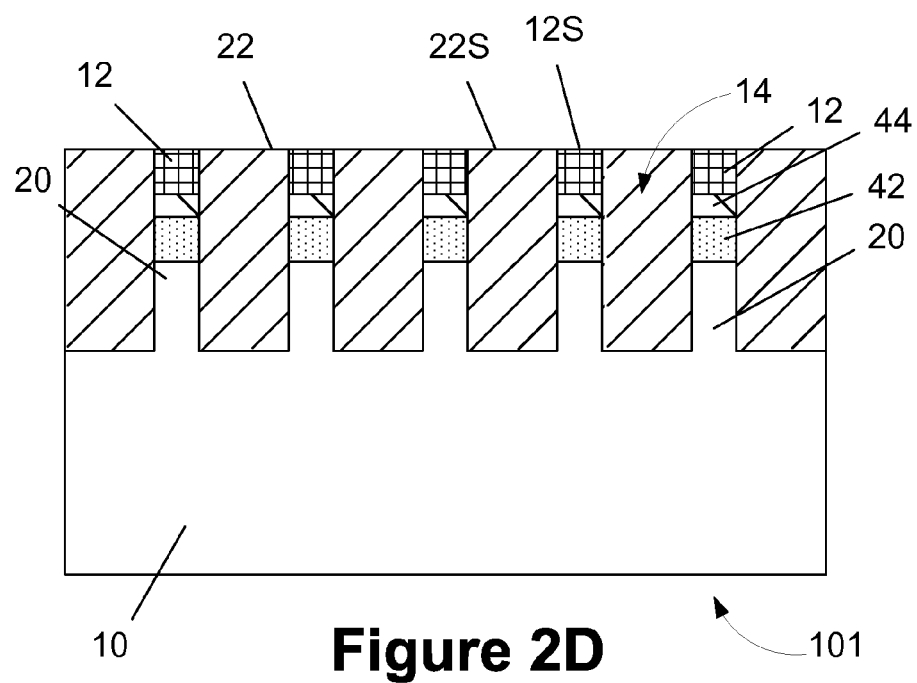

Then, as shown in FIG. 2C, the above-described layer of insulating material 22 was formed in the trenches 14 of the device such that it overfills the trenches 14. Next, as shown in FIG. 2D, one or more chemical mechanical polishing (CMP) processes were performed to planarize the surface of the layer of insulating material 22 using the patterned hard mask layer 12 to stop the CMP process. After such a CMP process, the surface 22S of the layer of insulating material 22 is substantially level with the surface 12S of the patterned hard mask layer 12.

Figure 2E:
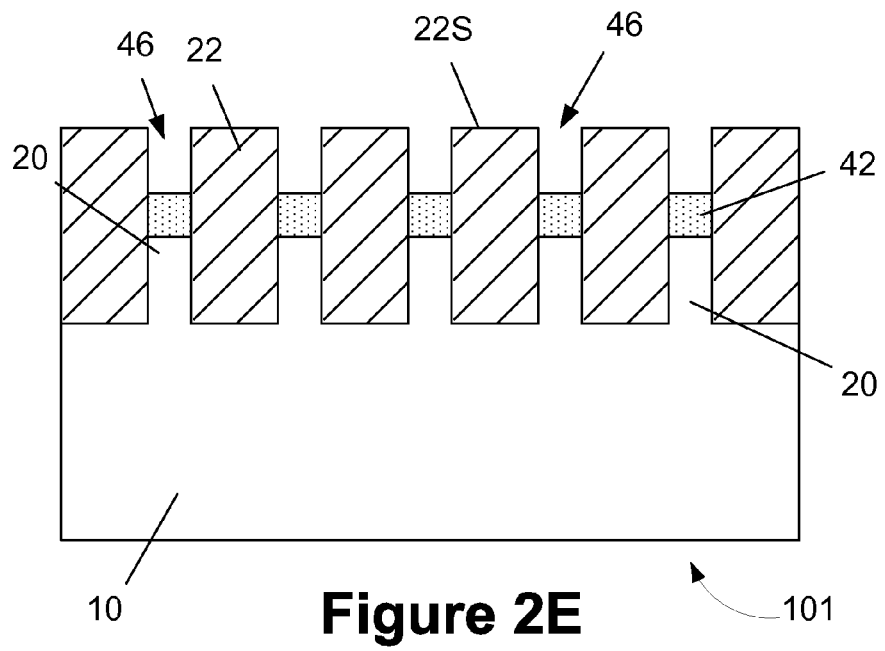

FIG. 2E depicts the device 101 after one or more etching processes, wet or dry, were performed to remove the patterned hard mask layer 12 and the pad oxide layer 44 from above the sacrificial layer of alternative semiconductor material 42. This etching process defines a plurality of cavities 46 that expose the sacrificial layer of alternative semiconductor material 42 for further processing.

Figure 2F:
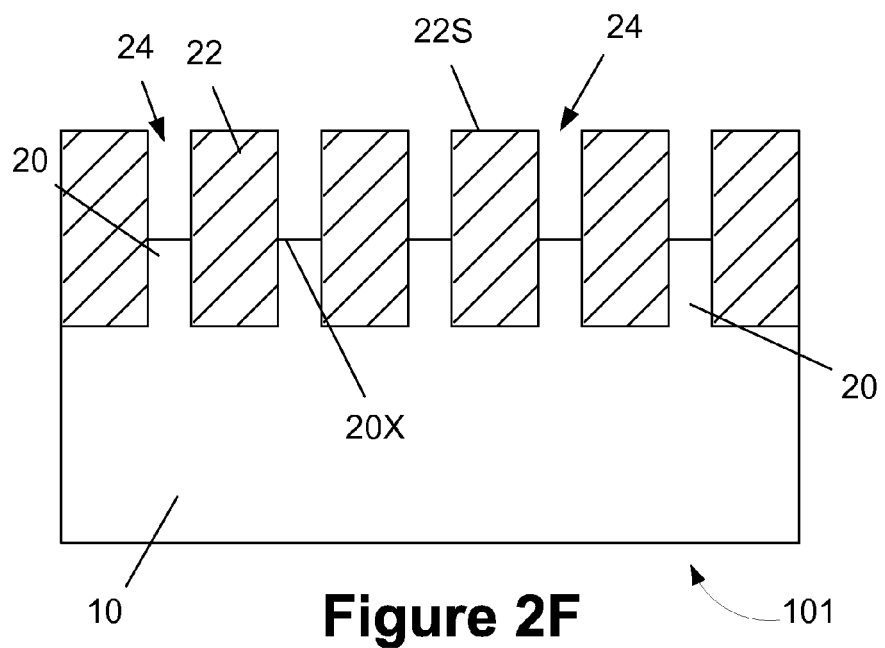

FIG. 2F depicts the device 101 after one or more etching processes, wet or dry, were performed to remove the sacrificial layer of alternative semiconductor material 42 and thereby define a plurality of the above-described substrate fin cavities 24 that expose the upper surface 20X of the substrate fins 20 for further processing. In this illustrative embodiment, the substrate fin cavities 24 have a depth that corresponds to the thickness of the hard mask layer 12, the pad oxide layer 44 and the sacrificial layer of alternative semiconductor material 42. In general, the substrate fin cavities 24 may have an aspect ratio of about 5 or less.

Figure 2G:
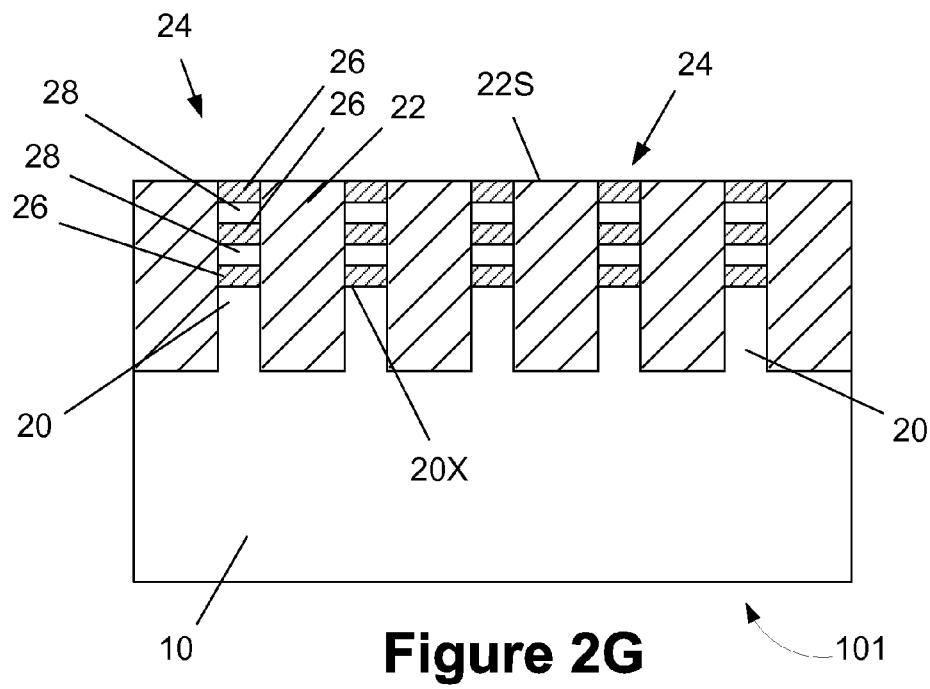

FIG. 2G depicts the device 101 after multiple layers of the above-described layers 26, 28 were alternatively formed within the substrate fin cavities 24 by performing several epitaxial growth processes. In the example depicted in FIG. 2G, two layers 26 and three layers 28 have been formed so as to substantially fill the substrate fin cavities 24. However, as noted above, the number and thickness of the layers 26, 28 that are formed may vary depending upon the particular application. FIG. 2G depicts the device 101 after a very light or "touch-up" CMP process was performed to planarize the upper surface of the device 101.

Figure 2H:
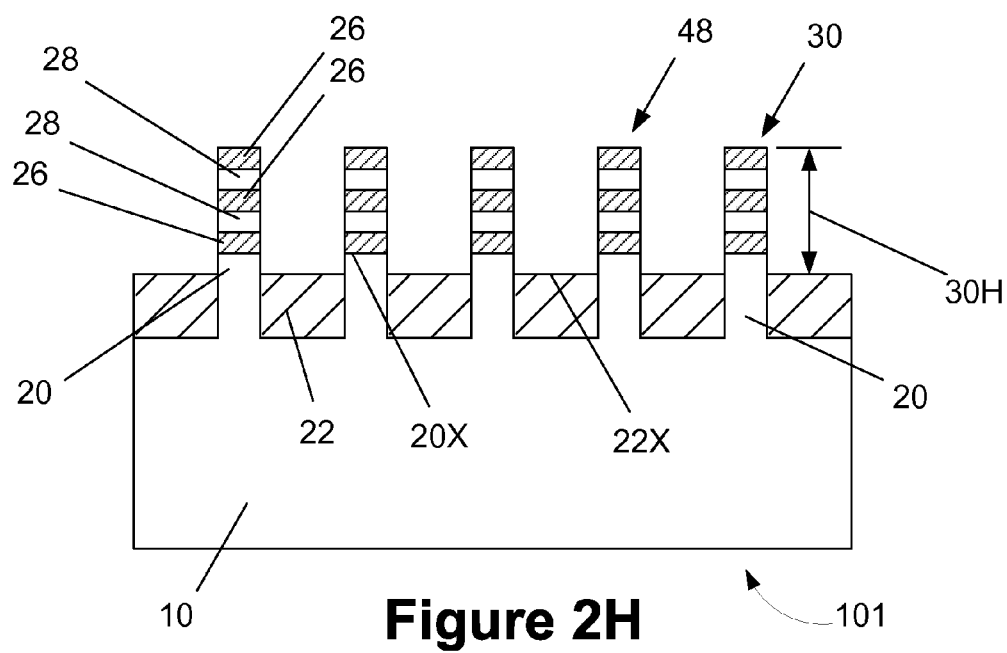

FIG. 2H depicts the device 101 after an etching process has been performed on the layer of insulating material 22 to reduce its thickness and thereby result in the layer of insulating material having a recessed surface 22X. As before, the recessed surface 22X of the layer of insulating material 22 essentially defines the final active fin height 30H of this embodiment of the fins 30 disclosed herein.

Figure 2I:
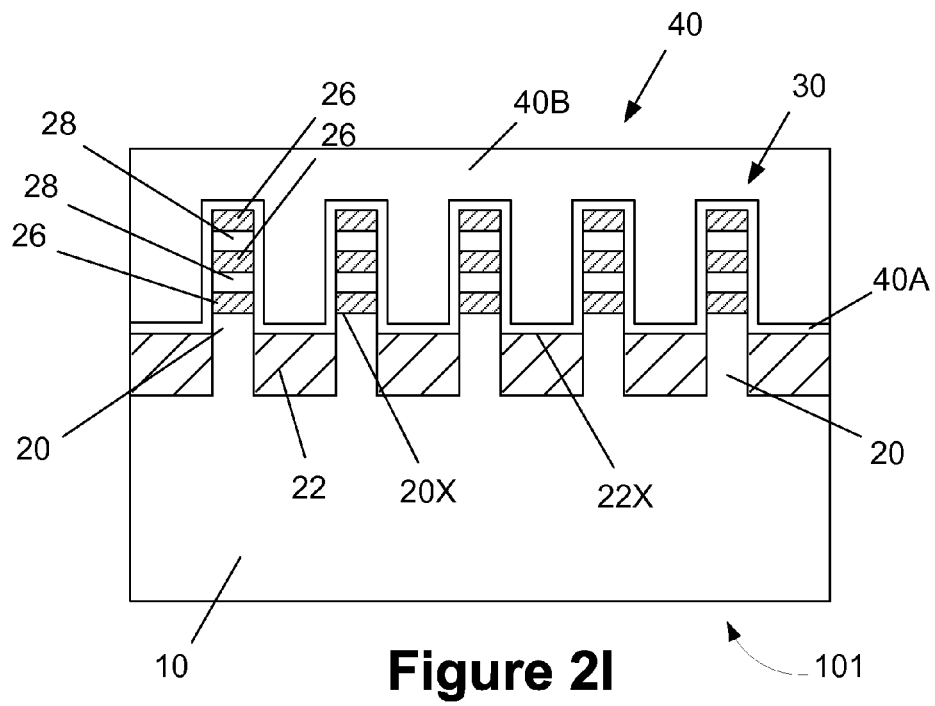

FIG. 2I depicts the device 101 after the above-described gate structure 40 has been formed for the device 101.

Figure 3A:
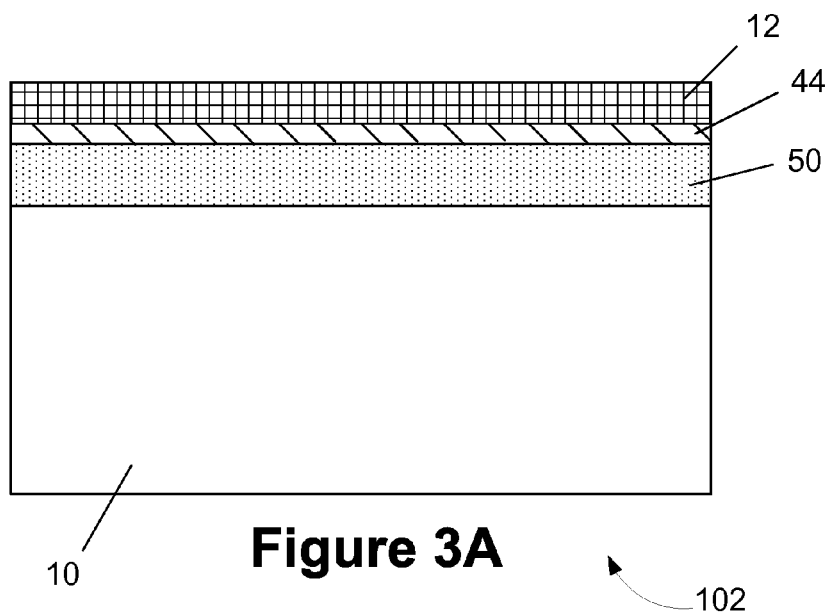
FIGS. 3A-3I depict yet another illustrative method disclosed herein for forming stressed multilayer FinFET devices with alternative channel materials.

FIGS. 3A-3I depict yet another illustrative method disclosed herein for forming a stressed multilayer FinFET device 102 with alternative channel materials. With reference to FIG. 3A, in this embodiment, a layer of alternative semiconductor material 50 (that is different than the semiconductor material of the substrate 10) is initially formed on the substrate 10 by performing an epitaxial growth process. The layer of alternative semiconductor material 50 may be comprised of a variety of different semiconductor materials, e.g., silicon/germanium, silicon/carbon, one or more III-V materials, one or more II-VI materials, InP, InAs, GaAs, InGaAs, InSb, InGaSb, etc., or combinations thereof, and it may be either doped (in situ) or undoped. In one illustrative embodiment, the layer of alternative semiconductor material 50 may be a fully-strained layer of silicon/germanium ($SiGe_{0.5}$) having a thickness of about 45 nm. Since silicon/germanium has a larger lattice structure than that of the underlying silicon substrate 10, the fully strained layer of alternative semiconductor material 50 will tend to "shrink" to match the lattice structure of the silicon substrate 10. This will result in the fully strained layer of alternative semiconductor material 50 having a compressive stress, the magnitude of which may range from about −500 to −2000 MPa. In some applications, the layer of alternative semiconductor material 50 may be formed to a sufficient thickness, e.g., about 200 nm, such that at least portion of the layer 50 is at least partially relaxed and perhaps fully relaxed. Even in cases where the layer of alternative semiconductor material 50 is initially formed in a fully strained condition, the additional process operations that are performed with the layer 50 in place may result in the layer 50 experiencing some degree of relaxation. For ease of disclosure, the layer of alternative semiconductor material 50 will be depicted as being a relatively thin layer of material that is initially formed in a fully strained condition. With continuing reference to FIG. 3A, the above-described pad oxide layer 44 and the above-described hard mask layer 12 are formed above the layer of alternative semiconductor material 50.

Figure 3B:
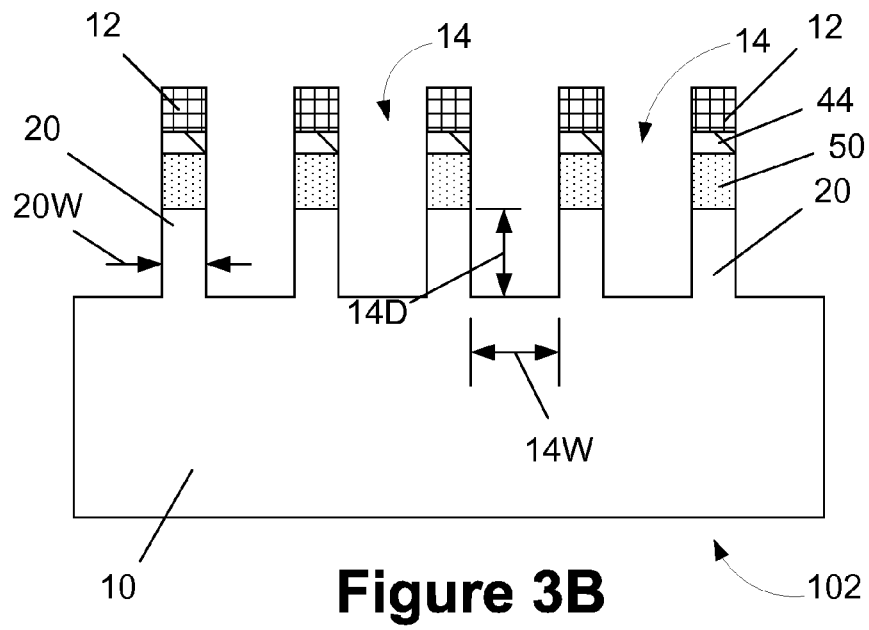

FIG. 3B depicts the device 102 after several process operations were performed. First, the above-described hard mask layer 12 and the pad oxide layer 44 were patterned using known sidewall image transfer techniques and/or photolithographic techniques combined with performing known etching techniques. Next, one or more etching processes, such as a dry or wet etching process, were performed on the layer of alternative semiconductor material 50 and the substrate 10 through the patterned hard mask layer 12 and pad oxide layer 44 to form the above-described trenches 14. As before, this etching process results in the definition of a plurality of substrate fins 20.

Figure 3C:
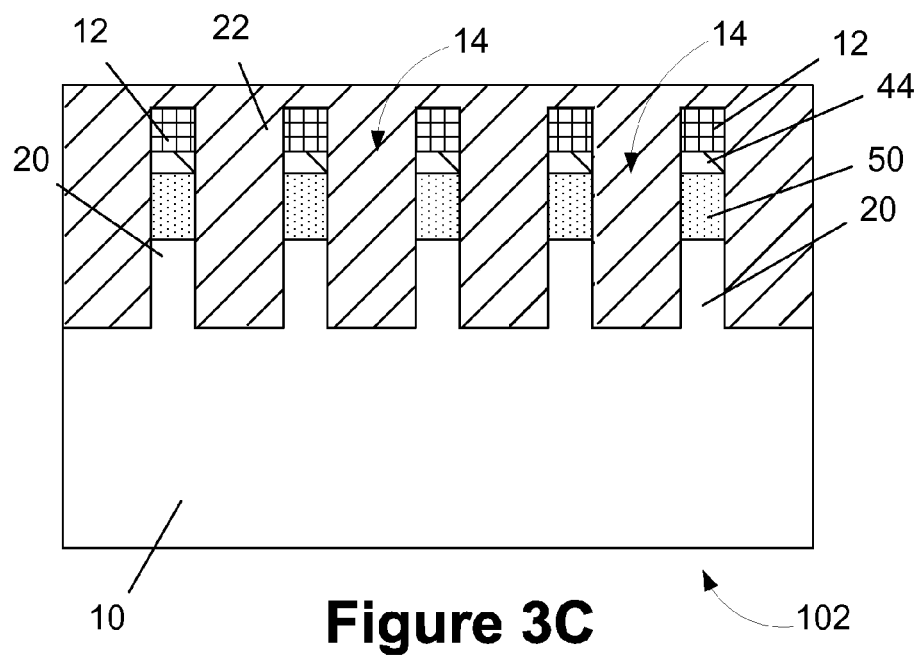
Figure 3D:
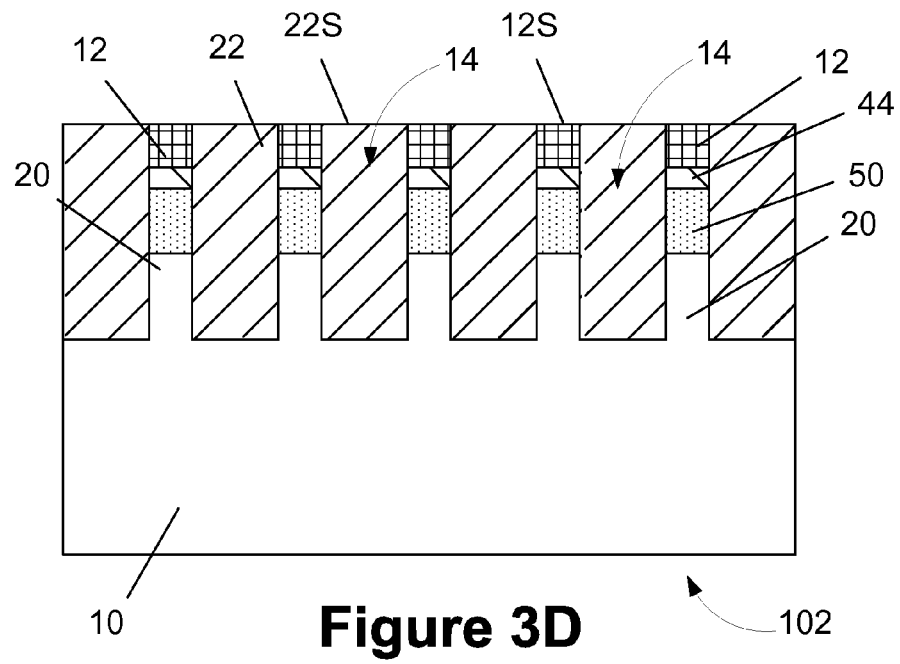

Then, as shown in FIG. 3C, the above-described layer of insulating material 22 was formed in the trenches 14 of the device such that it overfills the trenches 14. Next, as shown in FIG. 3D, one or more chemical mechanical polishing (CMP) processes were performed to planarize the surface of the layer of insulating material 22 using the patterned hard mask layer 12 to stop the CMP process. After such a CMP process, the surface 22S of the layer of insulating material 22 is substantially level with the surface 12S of the patterned hard mask layer 12.

Figure 3E:
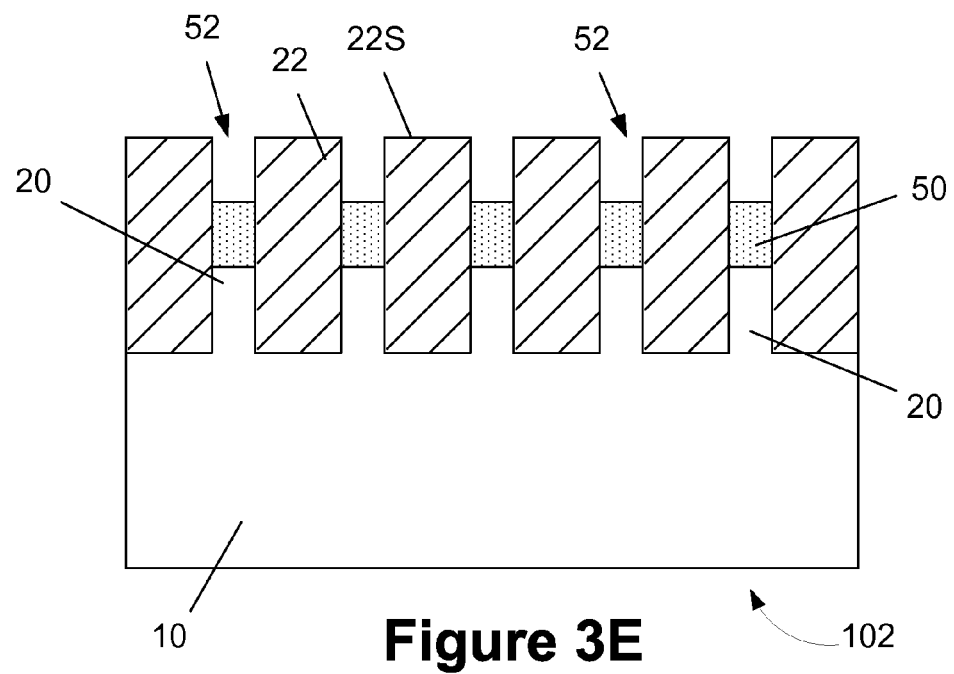

FIG. 3E depicts the device 102 after one or more etching processes, wet or dry, were performed to remove the patterned hard mask layer 12 and the pad oxide layer 44 from above the layer of alternative semiconductor material 50. This etching process defines a plurality of cavities 52 that expose the layer of alternative semiconductor material 50 for further processing.

Figure 3F:
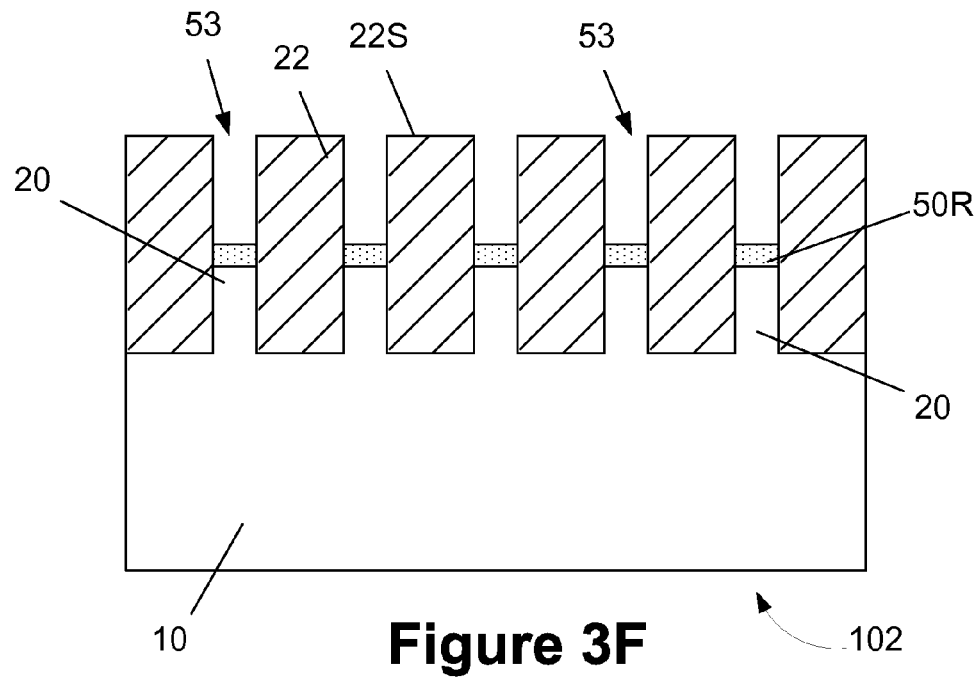

FIG. 3F depicts the device 102 after a timed etching process was performed to reduce the thickness of the layer of alternative semiconductor material 50 and thereby define a reduced-thickness layer of alternative semiconductor material 50R. In one illustrative embodiment, the reduced-thickness layer of alternative semiconductor material 50R may have a thickness that falls within the range of about 10-15 nm. This process operation also results in the definition of fin cavities 53 above the reduced-thickness layer of alternative semiconductor material 50R, wherein the fin cavities 53 may have a depth of about 55-75 nm. In general, the fin cavities 53 may have an aspect ratio of about 5 or less.

Figure 3G:
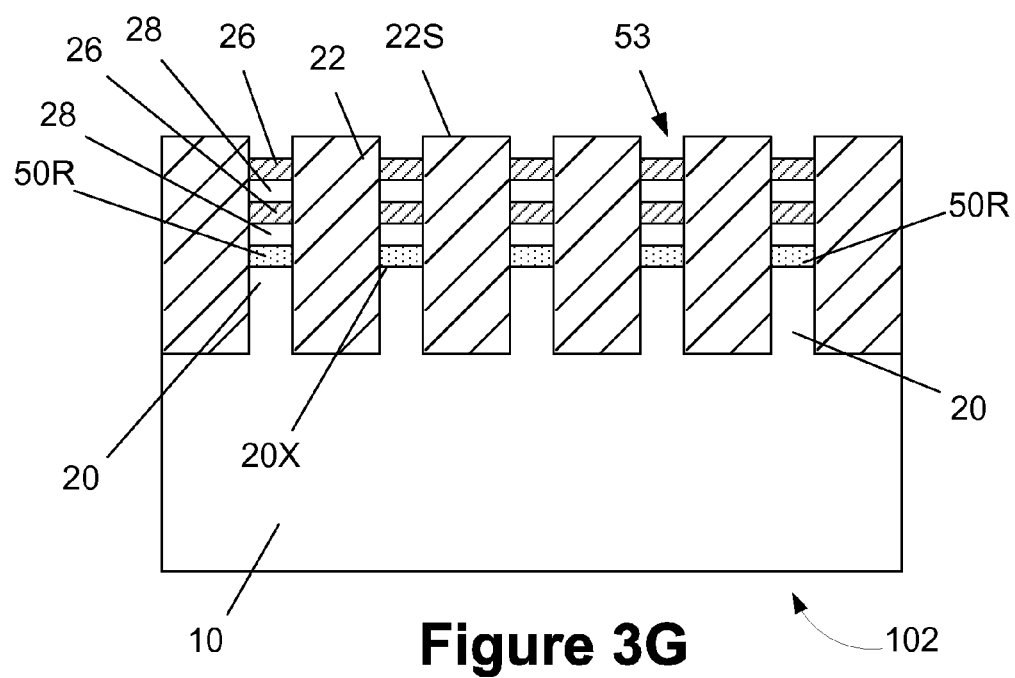

FIG. 3G depicts the device 102 after multiple layers of the above-described layers 26, 28 were alternatively formed within the fin cavities 53 by performing several epitaxial growth processes. In the example depicted in FIG. 3G, two layers 26 and two layers 28 have been formed in the fin cavities 53. In this example, the layers 26, 28 do not substantially fill the fin cavities 53. However, as noted above, the number and thickness of the layers 26, 28 that are formed may vary depending upon the particular application. As will be appreciated by those skilled in the art after a complete reading of the present application, the reduced-thickness layer of alternative semiconductor material 50R, which will relax to at least some degree as fabrication proceeds, will act as a buffer layer such that the layers 28 of substrate semiconductor material will exhibit a tensile stress. That is, due to the relaxed characteristic of the reduced-thickness layer of alternative semiconductor material 50R, the layers 28 of substrate semiconductor material formed on the layer of alternative semiconductor material 50 will exhibit the lattice structure and stress characteristics of the reduced-thickness layer of alternative semiconductor material 50R. The magnitude of the tensile stress in the layers 28 of substrate semiconductor material may vary depending upon the particular application.

For example, in one embodiment, the layers 28 of substrate semiconductor material may exhibit a tensile stress of about 500 to 2000 MPa.

Figure 3H:
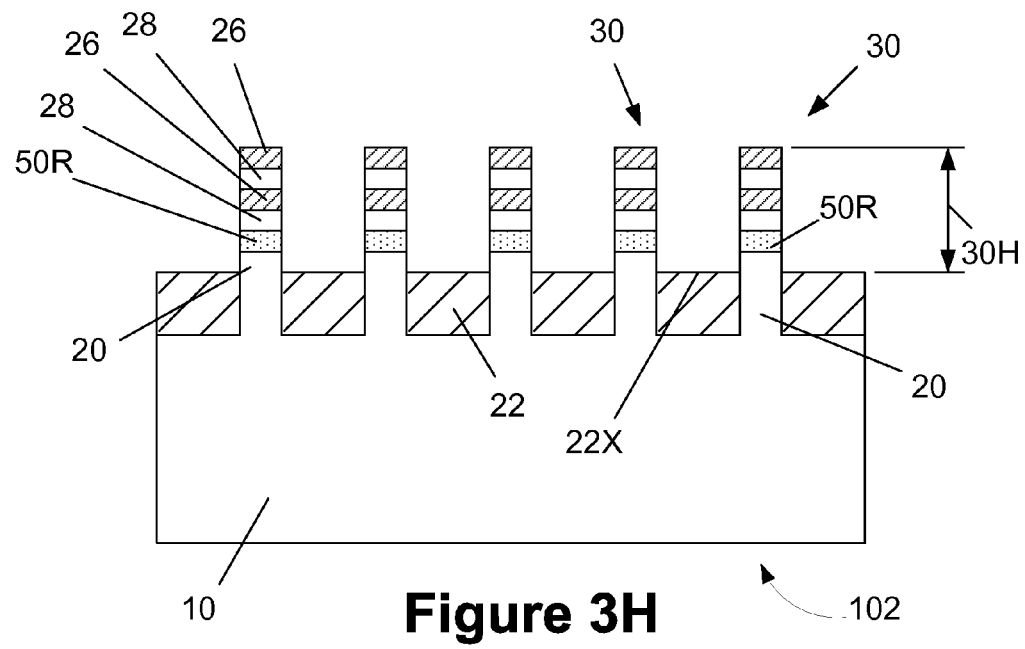

FIG. 3H depicts the device 102 after an etching process has been performed on the layer of insulating material 22 to reduce its thickness and thereby result in the layer of insulating material having a recessed surface 22X. As before, the recessed surface 22X of the layer of insulating material 22 essentially defines the final active fin height 30H of this embodiment of the fins 30 disclosed herein.

Figure 3I:
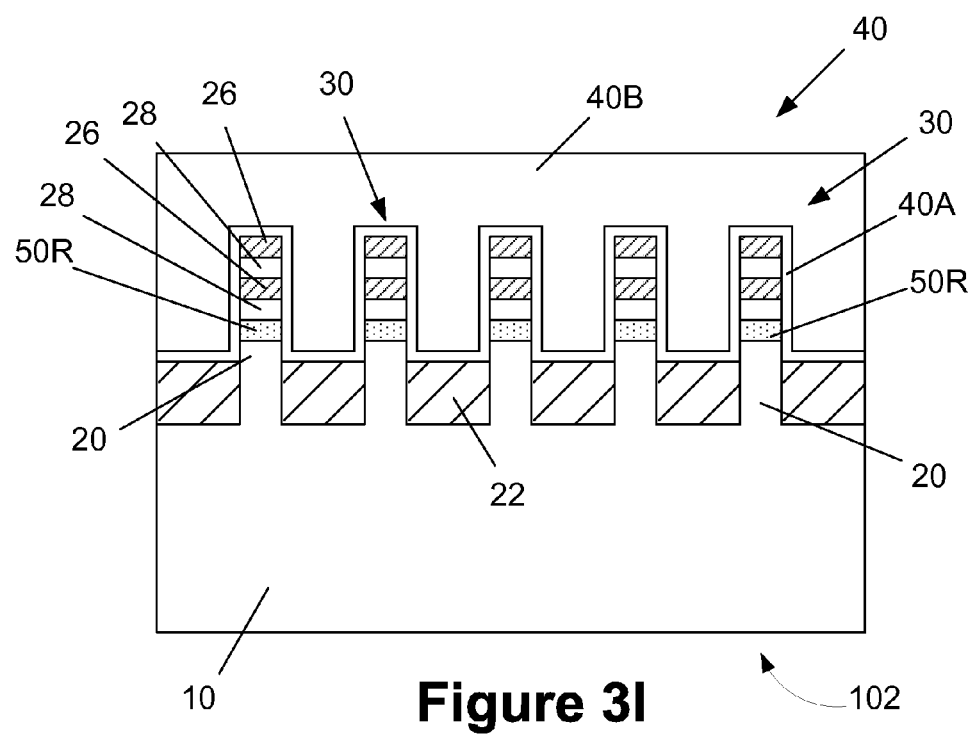

FIG. 3I depicts the device 102 after the above-described gate structure 40 has been formed for the device 102.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a FinFET device, comprising:
   performing at least one first etching process to define a plurality of spaced-apart trenches in a substrate so as to define a substrate fin that is comprised of a first semiconductor material;
   performing at least one process operation to form a substrate fin cavity above said substrate fin, said substrate fin cavity being defined by an exposed upper surface of said substrate fin and a layer of insulating material positioned in said trenches;
   forming a first layer of a second semiconductor material on said exposed upper surface of said substrate fin and within said substrate fin cavity, wherein said second semiconductor material is a different semiconductor material than said first semiconductor material;
   forming a first layer of said first semiconductor material on said first layer of said second semiconductor material and within said substrate fin cavity;
   performing at least one second etching process on said layer of insulating material such that an upper surface of said layer of insulating material after said at least one second etching process is performed is below said upper surface of said substrate fin so as to thereby expose a fin for said device that is comprised of at least said first layer of said second semiconductor material and said first layer of said first semiconductor material; and
   forming a gate structure around at least said first layer of said second semiconductor material and said first layer of said first semiconductor material.

2. The method of claim 1, wherein, prior to performing said at least one second etching process, the method further comprises:

forming a second layer of said second semiconductor material on said first layer of said first semiconductor material and within said substrate fin cavity; and forming a second layer of said first semiconductor material on said second layer of said second semiconductor material and within said substrate fin cavity.

3. The method of claim 2, wherein said first and second layers of said second semiconductor material each exhibit a compressive stress.

4. The method of claim 1, wherein said first layer of said second semiconductor material exhibits a compressive stress.

5. The method of claim 1, wherein, prior to performing said at least one first etching process, the method includes forming a sacrificial layer of silicon/germanium on said substrate.

6. The method of claim 5, wherein said step of performing said at least one process operation to form said substrate fin cavity comprises performing an etching process to remove said sacrificial layer of silicon/germanium so as to thereby expose said upper surface of said substrate fin.

7. A method of forming a FinFET device, comprising:

performing at least one first etching process to define a plurality of spaced-apart trenches in a substrate so as to define a substrate fin that is comprised of a first semiconductor material and a first layer of a second semiconductor material positioned on said substrate fin, wherein said second semiconductor material is a different semiconductor material than said first semiconductor material;

performing at least one process operation to form a cavity above said layer of said second semiconductor material and above said substrate fin, said cavity being defined by an exposed upper surface of said first layer of said second semiconductor material and a layer of insulating material positioned in said trenches;

performing at least one second etching on said exposed surface of said first layer of said second semiconductor material to reduce its thickness and thereby define a reduced thickness first layer of said second semiconductor material and define a fin cavity that is defined by an upper surface of said reduced thickness first layer of said second semiconductor material and said layer of insulating material positioned in said trenches;

forming a first layer of said first semiconductor material on said reduced thickness first layer of said second semiconductor material and within said fin cavity;

performing at least one third etching process on said layer of insulating material such that an upper surface of said layer of insulating material after said at least one third etching process is performed is below an upper surface of said substrate fin so as to thereby expose a fin for said device that is comprised of at least said reduced thickness first layer of said second semiconductor material and said first layer of said first semiconductor material; and forming a gate structure around at least said reduced thickness first layer of said second semiconductor material and said first layer of said first semiconductor material.

8. The method of claim 7, wherein, prior to performing said at least one third etching process, the method further comprises:

forming a second layer of said second semiconductor material on said first layer of said first semiconductor material and within said fin cavity; and forming a second layer of said first semiconductor material on said second layer of said second semiconductor material and within said fin cavity.

9. The method of claim 8, wherein said reduced thickness first layer of said second semiconductor material and second layer of said second semiconductor material each exhibit a tensile stress.

10. The method of claim 7, wherein said reduced thickness first layer of said second semiconductor material exhibits a tensile stress.

* * * * *